(12) United States Patent
Mullert (10) Patent No.: US 10,673,161 B1
(45) Date of Patent: Jun. 2, 2020

(54) CONDUCTIVE CONNECTOR

(71) Applicant: Acacia Communications, Inc., Maynard, MA (US)

(72) Inventor: David Mullert, Rehoboth, MA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/357,702

(22) Filed: Mar. 19, 2019

Related U.S. Application Data (60) Provisional application No. 62/661,547, filed on Apr. 23, 2018.

(51) Int. Cl.
*H01R 12/00* (2006.01)
*H01R 12/73* (2011.01)
*H01R 12/72* (2011.01)

(52) U.S. Cl.
CPC .......... *H01R 12/73* (2013.01); *H01R 12/721* (2013.01)

(58) Field of Classification Search
CPC .............................. H01R 12/73; H01R 12/721
USPC .......................................................... 439/65
See application file for complete search history.

(56) References Cited

U.S. PATENT DOCUMENTS

| | | | | |
|---|---|---|---|---|
| 2,766,435 A | * | 10/1956 | French | H01R 33/7671 439/263 |
| 3,482,565 A | * | 12/1969 | Gowen | A61B 5/02255 600/480 |
| 3,654,585 A | * | 4/1972 | Wickersham | G01R 1/073 439/65 |
| 3,980,367 A | * | 9/1976 | Laserson | H01R 12/523 439/65 |
| 4,577,090 A | * | 3/1986 | Obara | B23K 11/362 219/137.9 |
| 4,760,495 A | * | 7/1988 | Till | F16B 5/0233 174/138 D |
| 4,780,098 A | * | 10/1988 | Seidler | H01R 4/02 439/65 |
| 4,810,349 A | * | 3/1989 | Hishida | G01N 27/417 204/406 |
| 4,875,140 A | * | 10/1989 | Delpech | H05K 7/142 361/789 |
| 5,020,524 A | * | 6/1991 | Donohue | A61F 5/0118 602/22 |
| 5,102,352 A | * | 4/1992 | Arisaka | H01R 12/523 439/47 |

(Continued)

*Primary Examiner* — Abdullah A Riyami
*Assistant Examiner* — Vladimir Imas
(74) *Attorney, Agent, or Firm* — Joseph D'Angelo (57) ABSTRACT

A system and apparatus for increasing connectivity of a circuit board comprising a connector, wherein the connector has a horizontal body and a hollow cylindrical portion extruding vertically from the body; wherein the cylindrical portion is made up of a set of pieces; wherein at least a piece of the set of pieces is arranged to expand horizontally upon insertion of a phalanx head in a vertical manner. A method to increase current connectivity comprising screwing a fastener into threads of a connector through a hollow cylindrical portion of the connector; wherein the hollow cylindrical portion of the connector is made up of a set of pieces; wherein the screwing causes a phalanx head to contact the cylindrical portion expanding at least one piece of the set of pieces in a horizontal manner in relation to the fastener.

19 Claims, 6 Drawing Sheets

(56) References Cited

U.S. PATENT DOCUMENTS

| | | | | |
|---|---|---|---|---|
| 5,137,456 A * | 8/1992 | Desai | | H01R 12/52 439/591 |
| 5,347,929 A * | 9/1994 | Lerche | | E21B 43/1185 102/202.14 |
| 5,462,440 A * | 10/1995 | Rothenberger | | H01R 43/24 439/591 |
| 5,720,556 A * | 2/1998 | Krellner | | G01K 1/16 338/28 |
| 5,754,412 A * | 5/1998 | Clavin | | H05K 7/142 174/138 D |
| 5,956,835 A * | 9/1999 | Aksu | | G01R 1/07328 174/166 S |
| 6,199,470 B1 * | 3/2001 | Dewan | | B64D 1/06 89/1.41 |
| 6,399,887 B1 * | 6/2002 | Lin | | G06F 1/184 174/138 D |
| 6,623,279 B2 * | 9/2003 | Derian | | G06F 1/18 257/E23.088 |
| 6,654,464 B2 * | 11/2003 | Roussy | | H01R 13/6608 379/433.03 |
| 6,783,361 B2 * | 8/2004 | Huge | | A61C 7/10 433/7 |
| 7,104,805 B2 * | 9/2006 | Hjort | | H05K 1/144 439/74 |
| 7,137,826 B2 * | 11/2006 | Brodsky | | H01L 23/49811 439/65 |
| 7,220,131 B1 * | 5/2007 | Pecht | | H01L 24/10 257/E23.021 |
| 7,891,980 B2 * | 2/2011 | Frasco | | H05K 1/023 439/65 |
| 8,105,092 B2 * | 1/2012 | Weidner | | H01R 24/50 439/581 |
| 8,210,854 B2 * | 7/2012 | Orris | | H01R 12/7088 361/804 |
| 8,545,237 B2 * | 10/2013 | Johnson | | H01R 12/523 439/75 |
| 8,734,167 B2 * | 5/2014 | Aimoto | | H01R 13/187 439/74 |
| 9,343,854 B2 * | 5/2016 | Nakamura | | H01R 24/38 |
| 9,788,920 B2 * | 10/2017 | Lacaze | | A61C 8/0033 |
| 10,128,587 B2 * | 11/2018 | Ho | | H01R 12/58 |
| 10,312,612 B2 * | 6/2019 | Ho | | H01R 12/7052 |
| 2005/0042574 A1 * | 2/2005 | Lazarof | | A61C 8/0022 433/174 |
| 2011/0172774 A1 * | 7/2011 | Varela | | A61F 2/447 623/17.16 |
| 2011/0207080 A1 * | 8/2011 | Maadi | | A61C 13/0001 433/148 |

* cited by examiner

CONDUCTIVE CONNECTOR

RELATED APPLICATION

This application claims the benefit of U.S. provisional patent application 62/661,547 filed Apr. 23, 2018, titled "Conductive Connector," which is incorporated herein by reference in its entirety for all purposes.

BACKGROUND

Often, it may be necessary to electrically connect two circuit boards.

SUMMARY

A method, system, and apparatus for increasing current connectivity of a circuit board.

BRIEF DESCRIPTION OF THE FIGURES

Various aspects and embodiments of the application will be described with reference to the following example embodiments. It should be appreciated that the figures are not necessarily drawn to scale.

DETAILED DESCRIPTION

Typically, connecting two circuit boards when a high current transfer is required by the connection may be challenging. Generally, such a connection requires a conductive connection capable of carrying high current. Conventionally, current connectors may not be sufficient to carry such current.

In most embodiments, Applicants have realized that an air gap between a board, such as one with a plated barrel, and a connector may lower surface area able to conduct current between the board and the connector. In many embodiments, an air gap may limit the amount of current that may be transferred between boards because of a limit of the conductive area connecting the board and the connector. In certain embodiments, Applicant has realized it may be beneficial to increase a surface area between a board and a connector.

In many embodiments, a cut out portion of a board for a cylindrical connector may be called a barrel. In some embodiments, a barrel cutout of a board may be plated with a conductive material. In most embodiments, if a connector between two boards were able to make conductive contact with a portion of a plated barrel of a connector, the amount of power or current transferred by a connector may be increased. In certain embodiments, plating inside a barrel or a cutout of a board may be called a power plane board. In certain embodiments, enabling a connector to hook into plating in a barrel of a board may increase the amount of current transferred by a connector.

In further embodiments, a connector with an expandable cylindrical portion for insertion into a barrel may be able to make contact with the plated barrel of a board through expansion, or forming the cylindrical portion may increase the surface area of the connector in contact with the board. In certain embodiments, a fastener may be used to expand an expandable portion of a connector to force the connector to make contact with plating of a power board. In some embodiments, a fastener may force petals of a connector to be in contact with plating of a board to increase the amount of power able to be transferred. In many embodiments, pieces of a connector may be forced to hook into a plating of a barrel of a board by application of a fastener. In many embodiments, the techniques of the current disclosure may enable 50% or more of a plated barrel of a board to be conductively connected to a connector. In some embodiments, a cylindrical portion may expand like an expandable collet. In other embodiments, a cylindrical portion may expand in a similar manner to flower petals. In further embodiments, a cylindrical portion may be a malleable metal that may, through force, be forced to fill in an air gap.

In certain embodiments, a cylindrical portion of a connector may be copper. In some embodiments, a cylindrical portion of a connector may be silver. In certain embodiments, a cylindrical portion of a connector may be nickel. In certain embodiments, a cylindrical portion of a connector may be gold. In certain embodiments, a cylindrical portion of a connector may be silver. In other embodiments, a cylindrical portion of a connector may be nickel plated copper. In certain embodiments, a cylindrical portion of a connector may be gold plated copper. In many embodiments, the connector may be copper. In other embodiments, a connector may be copper coated with gold. In other embodiments, a connector may be copper coated with nickel. In other embodiments, a connector may be copper coated with silver.

In many embodiments, the current disclosure may enable connecting two circuit boards in a way that allows one or more of the connections to carry a high current. In certain embodiments, a connector may have a cylindrical portion that is malleable. In many embodiments, a malleable cylindrical portion may be formed using force to lower or eliminate an air gap. In certain embodiments, a screw or fastener attaching a board to a connector may have a phalanx type head or triangular head that may, when fastened, force a malleable cylindrical portion to reduce or remove an air gap as the screw or fastener is attached to the connector.

Figure 1:
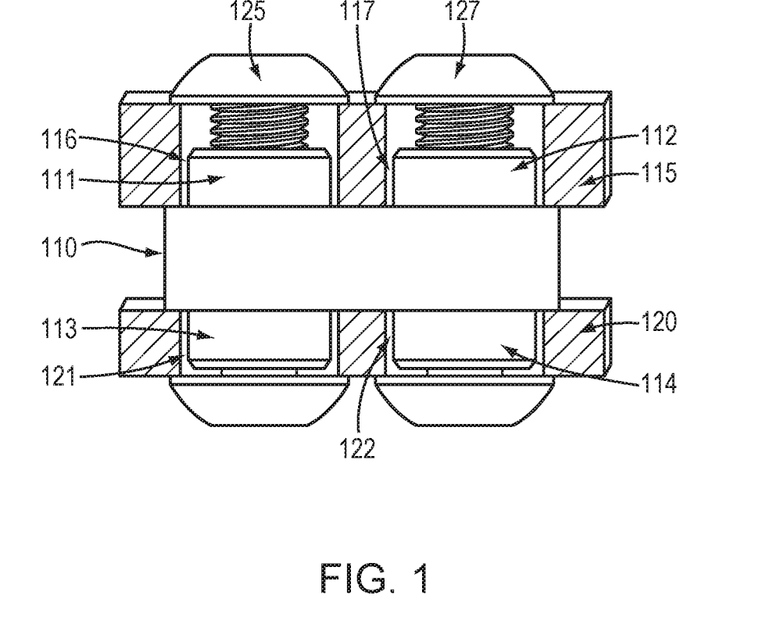
FIG. 1 is a simplified illustration of a connector with an air gap, according to an embodiment of the current disclosure.

Refer now to the example embodiment of FIG. 1. In the example embodiment of FIG. 1, connector 110 is a conductive element that is between board 115 and 120. In the example embodiment, board 115 and board 120 have cylindrical cut outs or barrels, which are coated with a conductive material, to receive cylindrical pieces, 111, 112, 113, and 114, of connector 110. In this embodiment, between board 115 and cylindrical pieces 111 and 112 of connector 110 there are air gaps, such as air gap 116 and 117, between the cylindrical pieces, 111 and 112, and the cylindrical cutouts of board 115, respectively. In this embodiment, the air gaps do not allow good conductivity between the plated barrel of the board and the connector. Screws 125 and 127 are screwed into the cylindrical cutout of board 115 to attach board 115 to connector 110. After screws 125 and 127 are attached, air gaps remain between cylindrical pieces of connector 110 and the cylindrical cutout of board 115.

Figure 2A:
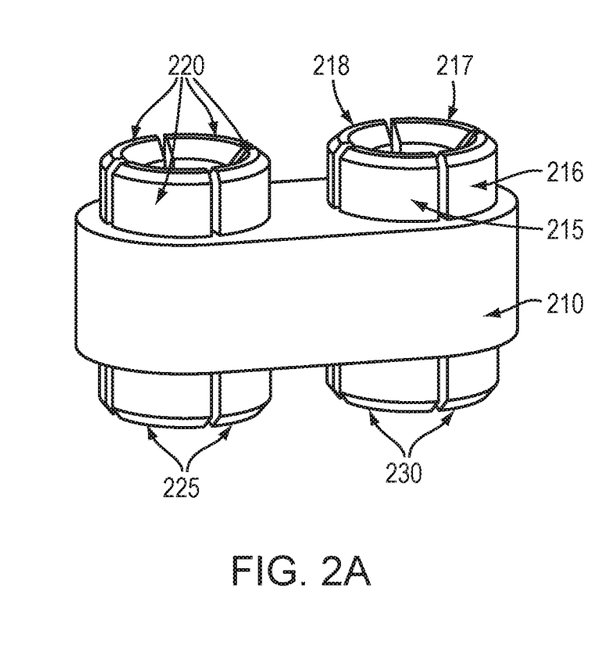
FIGS. 2a and 2b are alternative views of a simplified illustration of a female portion of a connector with petals, according to embodiments of the current disclosure.
Figure 2B:
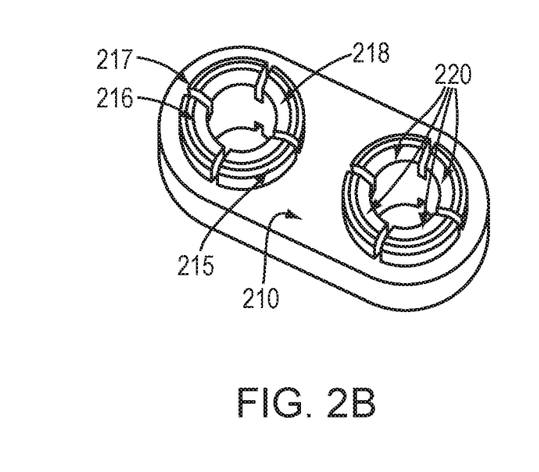

Refer now to the example embodiments of FIGS. 2a and 2b, which represent alternative views of a female portion of a connector with petals. The example embodiment of FIGS. 2a and 2b illustrate different views of connector 210. Connector 210 has four cylindrical pieces, such as piece 220, 225, and 230, sized to be insertable into a circuit board. Each cylindrical piece is composed of four pieces or petals such as piece 215, 216, 217, and 218. Each piece or petal is malleable such that each piece or petal may be bent or formed if a sufficient amount of force is applied to the piece or petal. Upon application of sufficient force, each piece or petal can close an air gap between the connector and the cylindrical piece. Each cylindrical piece of connector 210 is threaded to receive a screw type fastener. In the example embodiment of FIGS. 2a and 2b, there is spacing between each cylindrical piece. In other embodiments, each cylindrical piece may be layered similar to a closed flower with overlapping petals that may separate but may overlap when forced open. In further embodiments, each cylindrical piece may be arranged like a collet. In other embodiments, a cylindrical portion may be made of any number of pieces or petals.

Figure 3A:
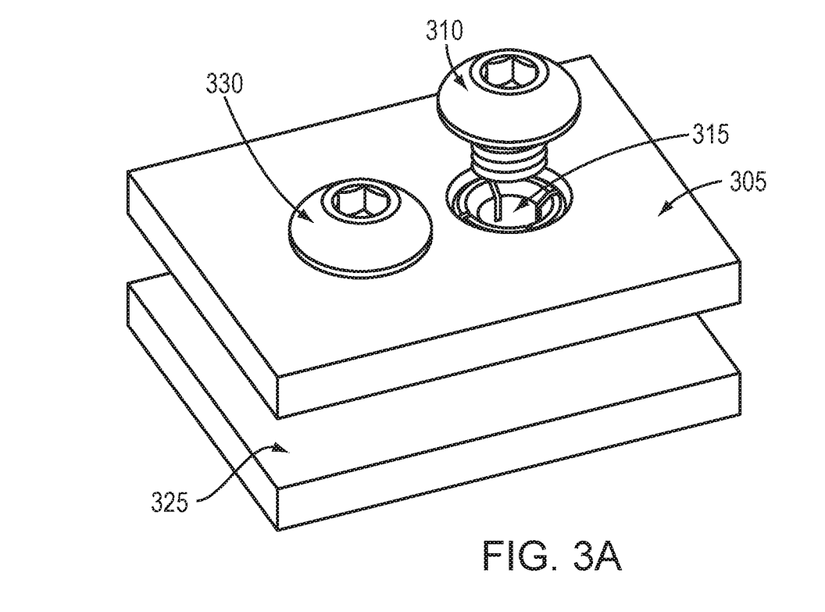
FIG. 3a is a simplified illustration of fasteners, a connector, and two circuit boards, according to an embodiment of the current disclosure.
Figure 3B:
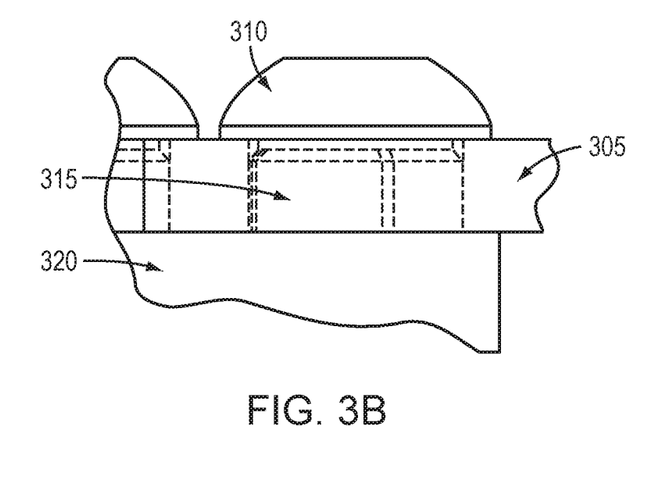
FIG. 3b is an illustration of a cut away of FIG. 3a with a second fastener screwed into a connector, according to an embodiment of the current disclosure.
Figure 4A:
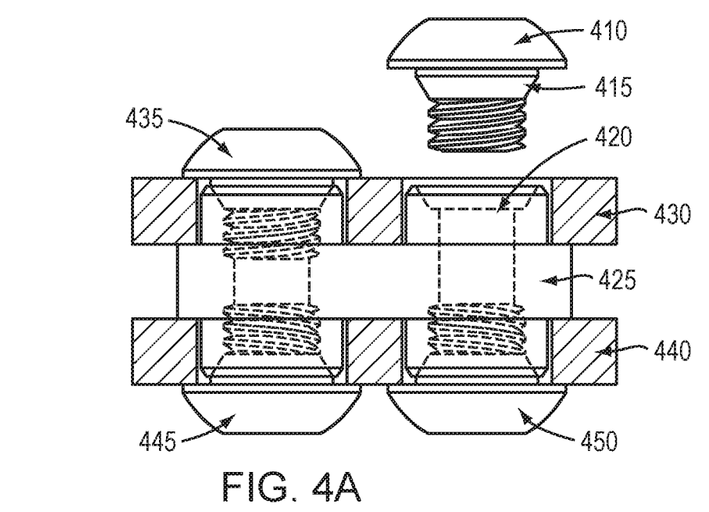
FIGS. 4a, 4b, and 4c are alternative views of a simplified illustration of phalanx head fasteners and a connector connecting two circuit boards, according to an embodiment of the current disclosure.
Figure 4B:
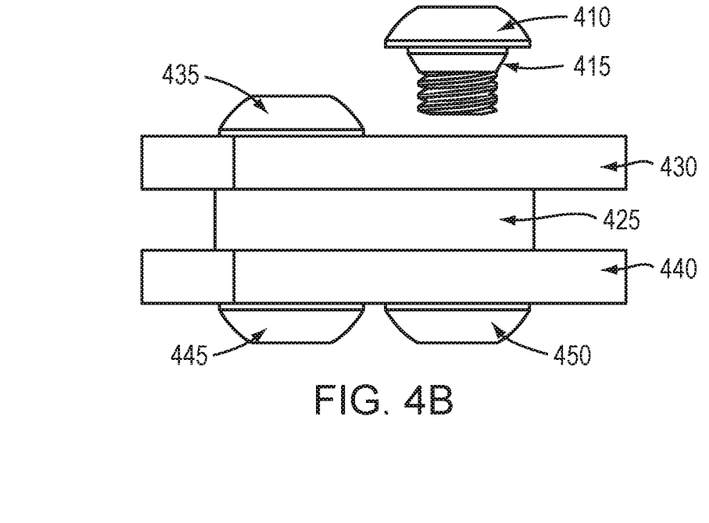
Figure 4C:
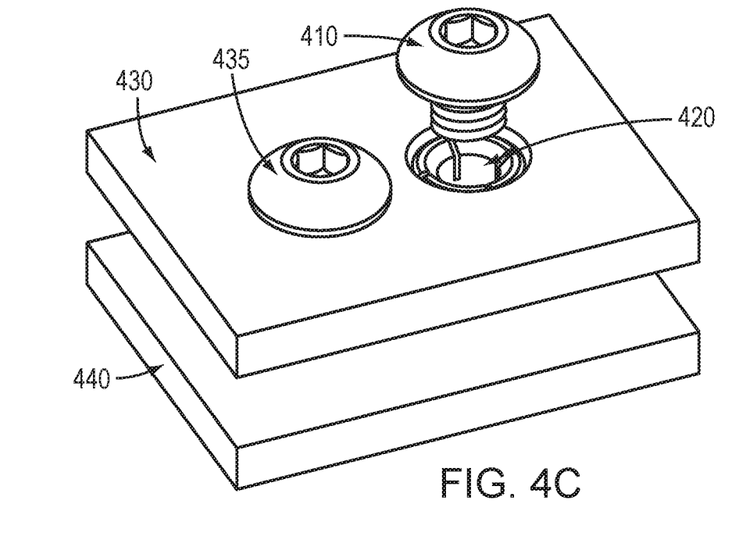
Figure 4D:
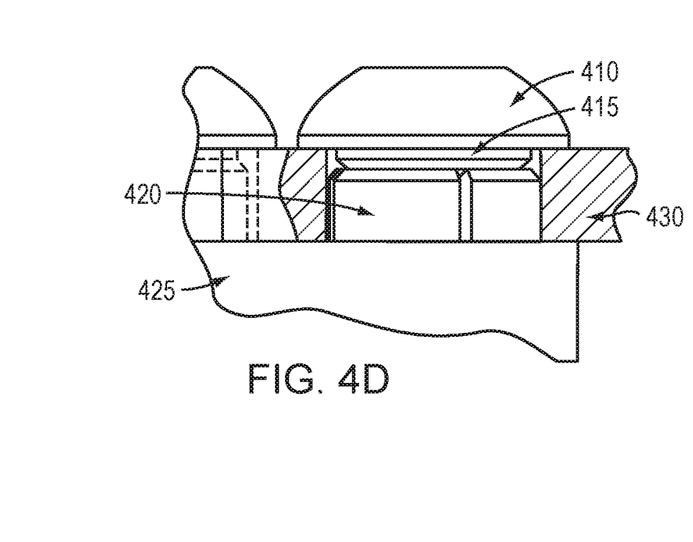
FIG. 4d is an illustration of a cut away of FIGS. 4a-c with a second fastener screwed into a connector, according to an embodiment of the current disclosure.

Refer now to the example embodiments of FIGS. 3a and 3b, which illustrate a connector, two boards, and two fasteners. In the example embodiments of FIGS. 3a and 3b, example embodiments of a fastener connecting two boards is illustrated. In FIG. 3a, board 305 is fastened by connector 310 to connector 320 by screwing fastener 310 into cylindrical portion 315 of connector 320. As illustrated in the example embodiment of FIGS. 2a and 2b, cylindrical portion 315 of fastener 310 has pieces or petals. In this example embodiment as shown in FIG. 3b, after fastener 310 is screwed into connector 320, the pieces or petals of cylindrical portion 315 are forced apart to fill a portion of an air gap between connector 320 and board 330 by fastener 310. FIG. 3a also illustrates a second fastener, fastener 330 and a second board, board 325. In these example embodiments, a barrel or the portion of the board with a cylindrical cut out is coated with a conductive material. In these embodiments, when the expandable portion of the connecter is pushed outwards it increases the surface area of connector 320 conductively connected to board 305.

Refer now to the example embodiment of FIGS. 4a, 4b, 4c, and 4d, which illustrate different views of a fastener, and two boards, where the connector is enabled to increase the ability to carry current between the boards. The example embodiment of FIGS. 4a-4d illustrate a fastener with a phalanx shaped head capable of applying force sufficient to a fastener, such as the fastener of FIG. 3, to close at least a portion of an air gap between a fastener and a board. Fastener 410, shown in different views in FIGS. 4a-4d, has phalanx head 415. Phalanx head 415, when inserted into cylindrical portion 420, causes the pieces or petals of cylindrical portion 420 to separate and/mold into the cylindrical cut out of board 430 to at least partially fill air gap between board 430 and cylindrical portion 420. Fastener 435 illustrates an example embodiment, in different views, of fastener 435 attached to connector 425 to board 430 that has forced the pieces or petals of cylindrical piece of connector 425 open to make contact with board 430. Also illustrated in FIGS. 4a-4d is second board 440 and fasteners 445 and 450 attached to connector 425 to hold board 440 to connector 425. In the example embodiment of FIGS. 4a-4d, the cylindrical cutout of each board is plated with a conductive material and removing an air gap increases the surface area of connector with the boards.

Figure 5A:
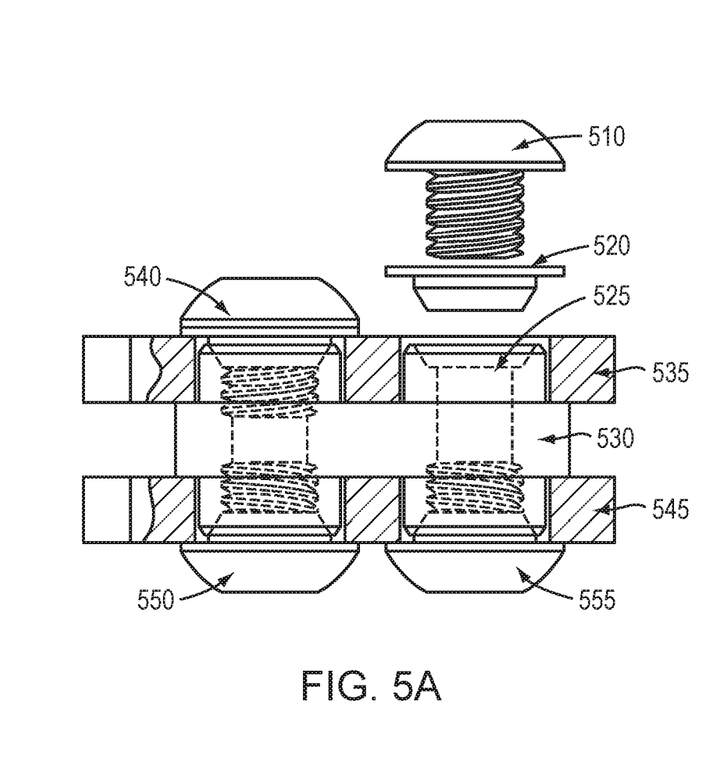
FIG. 5a is a simplified illustration of fasteners, phalanx type washers, a connector, and two boards, according to an embodiment of the current disclosure.
Figure 5B:
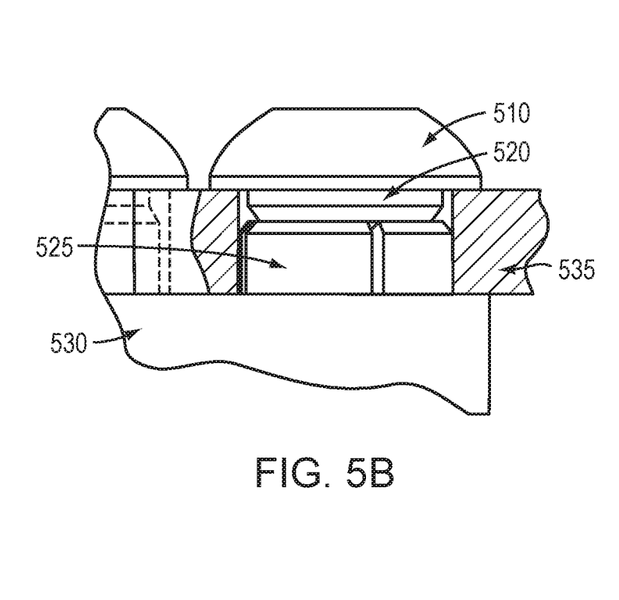
FIG. 5b is an illustration of a cut away of FIG. 5a with a second fastener pushed through a washer, screwed into a connector, according to an embodiment of the current disclosure.

Refer now to the example embodiments of FIGS. 5a and 5b, which illustrates an alternative embodiment of a fastener system able to apply force to a cylindrical portion of a connector to increase a surface area of the connecter in contact with a board. In the example embodiment of FIG. 5a, fastener 510 is a screw type fastener. Washer 520 is a phalanx shaped washer. Washer 520 is placed between fastener 510 and cylindrical portion 525 of connector 530 to connect board 535 to connector 530. As fastener 510 is fastened, or screwed, into cylindrical portion 525, fastener 510 comes in contact with washer 520, such as shown in FIG. 5b. As fastener 510 is continued to be fastened or screwed, washer 520 separates or forces pieces of cylindrical connector 525 to at least partially fill an air gap between board 535 and cylindrical portion of connector 530. Fastener 540 has been screwed into connector 530 to fasten board 535 into connector 530. Fasteners 550 and 555 are also screwed into board 545. In the example embodiment of FIGS. 5a and 5b, the cylindrical cutout of each board is plated with a conductive material and removing an air gap increases the surface area of connector 530 with the boards.

Figure 6:
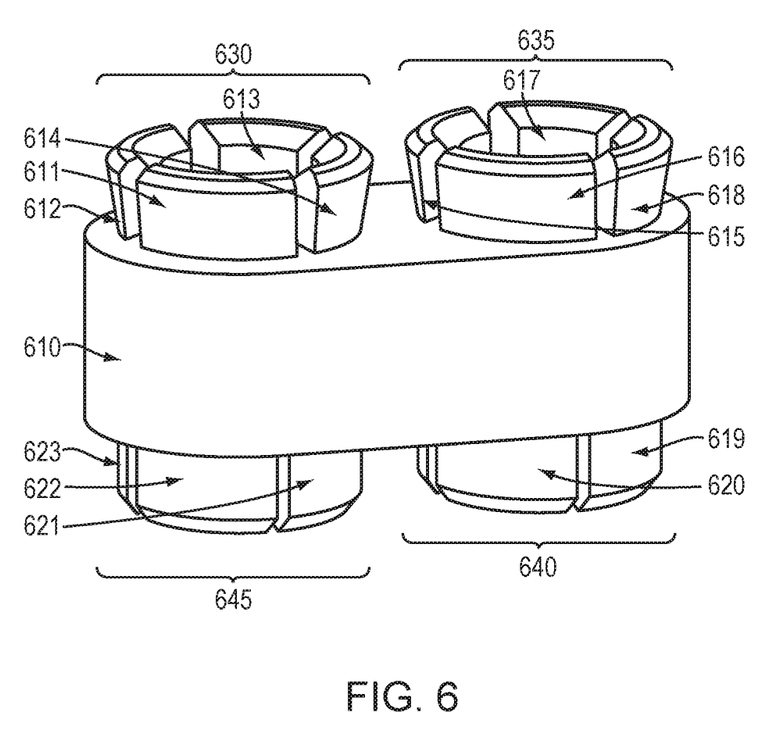
FIG. 6 is a simplified illustration of a connector with petals that have been pushed partially open, according to an embodiment of the current disclosure.

Refer now to the example embodiment of FIG. 6, which illustrates how pieces or petals of cylindrical portions of a connector may bend. Connector 610 has cylindrical portions 630, 635, 640, and 645. Cylindrical portion 630 has pieces or petals 611, 612, 613, and 614. In the example embodiment of FIG. 6, pieces 611, 612, 613, and 614 have been pushed outwards through the application of force by a fastener, such as that of fastener 410 of FIG. 4. Also, contrast the position of pieces 611, 612, 613, and 614 of FIG. 6 to the positions of pieces 215, 216, 217, and 218 of FIG. 2.

Referring back to FIG. 6, cylindrical portion 645 has visible petals 621, 622, and 623. In this example embodiment, cylindrical portion 645 has not been pushed outwards and represents a cylindrical portion before bending. Similarly, cylindrical portion 640 has visible portions 619 and 620. As with cylindrical portion 645, cylindrical portion 640 has not been pushed out. Cylindrical portion 635 has pieces 615, 616, 617, and 618 that have pushed out through the use of force.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. A system to increase current connectivity comprising:
    a phalanx head;
    a connector, wherein the connector has a horizontal body and a hollow cylindrical portion extruding vertically from the body; wherein the cylindrical portion is made up of a set of pieces; wherein the cylindrical portion has an inner circumference; wherein at least a piece of the set of pieces is arranged to expand horizontally upon insertion of the phalanx head in a vertical manner; wherein at least a first portion of the phalanx head is smaller than the inner circumference of the cylindrical portion and at least a second portion of the phalanx head is larger than the inner circumference of the cylindrical portion; wherein the connector has a hollow threaded portion vertically aligned with the hollow cylindrical portion; and
    a fastener with external threads sized to screw into the threaded portion of the connector.

2. The system of claim 1 wherein the hollow cylindrical portion of the connector is made of a conductive material.

3. The system of claim 1 wherein the hollow cylindrical portion of the connector is made of a malleable material.

4. The system of claim 1 wherein the fastener has the phalanx head.

5. The system of claim 1 further comprising a washer with the phalanx head.

6. A method to increase current connectivity comprising;
    screwing a fastener into threads of a connector through a hollow cylindrical portion of the connector; wherein the hollow cylindrical portion of the connector is made up of a set of pieces; wherein the screwing causes a phalanx head to contact the cylindrical portion expanding at least one piece of the set of pieces in a horizontal manner in relation to the fastener.

7. The method of claim 6 wherein the hollow cylindrical portion of the connector is made of a conductive material.

8. The method of claim 6 wherein the hollow cylindrical portion of the connector is made of a malleable material.

9. The method of claim 6 wherein the fastener has the phalanx head.

10. The method of claim 6 wherein a washer with the phalanx head is between the fastener and the connector.

11. The system of claim 1 wherein the hollow cylindrical portion is inserted into a conductively plated cutout of a circuit board.

12. The system of claim 1 wherein the at least a piece of the set of pieces is arranged to expand horizontally expands into the conductively plated cutout of the circuit board.

13. The method of claim 6 wherein the hollow cylindrical portion is inserted into a conductively plated cutout of a circuit board.

14. The method of claim 13 wherein the screwing causes at least a piece of the set of pieces to expand horizontally into the conductively plated cutout of the circuit board.

15. An apparatus to increase current connectivity, the apparatus comprising:
    a connector, wherein the connector has a horizontal body and a hollow cylindrical portion extruding vertically from the body; wherein the cylindrical portion is made up of a set of pieces; wherein the cylindrical portion has an inner circumference; wherein at least a piece of the set of pieces is arranged to expand horizontally upon insertion of a phalanx head in a vertical manner; wherein at least a first portion of the phalanx head is smaller than the inner circumference of the cylindrical portion and at least a second portion of the phalanx head is larger than the inner circumference of the cylindrical portion; wherein the connector has a hollow threaded portion vertically aligned with the hollow cylindrical portion.

16. The apparatus of claim 15 wherein the hollow cylindrical portion of the connector is made of a conductive material.

17. The apparatus of claim 15 wherein the hollow cylindrical portion of the connector is made of a malleable material.

18. The apparatus of claim 15 wherein the hollow cylindrical portion is inserted into a conductively plated cutout of a circuit board.

19. The apparatus of claim 15 wherein the at least a piece of the set of pieces is arranged to expand horizontally expands into the conductively plated cutout of the circuit board.

* * * * *